US011453944B2

(12) United States Patent
Washio et al.

(10) Patent No.: US 11,453,944 B2
(45) Date of Patent: Sep. 27, 2022

(54) ATOMIC LAYER DEPOSITION APPARATUS AND ATOMIC LAYER DEPOSITION METHOD

(71) Applicant: THE JAPAN STEEL WORKS, LTD., Tokyo (JP)

(72) Inventors: Keisuke Washio, Kanagawa (JP); Tatsuya Matsumoto, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 657 days.

(21) Appl. No.: 16/324,556

(22) PCT Filed: Apr. 24, 2017

(86) PCT No.: PCT/JP2017/016189
§ 371 (c)(1),
(2) Date: Feb. 9, 2019

(87) PCT Pub. No.: WO2018/042756
PCT Pub. Date: Mar. 8, 2018

(65) Prior Publication Data
US 2019/0177842 A1 Jun. 13, 2019

(30) Foreign Application Priority Data

Aug. 31, 2016 (JP) .............................. JP2016-168994

(51) Int. Cl.
C23C 16/455 (2006.01)
C23C 16/458 (2006.01)
(Continued)

(52) U.S. Cl.
CPC ........ C23C 16/45544 (2013.01); C23C 16/44 (2013.01); C23C 16/4401 (2013.01);
(Continued)

(58) Field of Classification Search
None
See application file for complete search history.

(56) References Cited

U.S. PATENT DOCUMENTS 6,045,862 A * 4/2000 Mizukami ............. C23C 16/455
427/248.1
6,296,712 B1 * 10/2001 Guo ....................... C23C 16/455
118/728
(Continued)

FOREIGN PATENT DOCUMENTS

JP     H05-304102 A    11/1993
JP     H11-087326 A     3/1999
(Continued)

OTHER PUBLICATIONS

International Search Report from International Patent Application No. PCT/JP2017/016189, dated Jun. 13, 2017.
(Continued)

Primary Examiner — Ram N Kackar
Assistant Examiner — Laureen Chan
(74) Attorney, Agent, or Firm — SGPatents PLLC

(57) ABSTRACT

An atomic layer deposition apparatus includes a film-forming container 11 in which a film-forming process is performed, a vertically movable stage 14 configured to hold a substrate 100, a susceptor 50 held on the stage 14 and being configured to hold the substrate 100, and a stage stopper 17 configured to stop rising of the stage 14 and, when in contact with the susceptor 50, partitioning a film-forming space S in which the film-forming process is performed and a transporting space in which transport of the substrate 100 is performed. Further, the susceptor 50 includes an upper susceptor substrate holding portion 52B configured to hold the substrate 100, and an upper susceptor peripheral portion 52A arranged in a periphery of the upper susceptor substrate
(Continued)

holding portion 52B, wherein a susceptor deposition prevention member 15 is provided on the upper susceptor peripheral portion 52A.

17 Claims, 7 Drawing Sheets

(51) Int. Cl.
*H01L 21/687* (2006.01)
*C23C 16/44* (2006.01)

(52) U.S. Cl.
CPC .......... *C23C 16/455* (2013.01); *C23C 16/458* (2013.01); *C23C 16/4586* (2013.01); *C23C 16/45519* (2013.01); *C23C 16/45521* (2013.01); *C23C 16/45527* (2013.01); *H01L 21/68735* (2013.01); *H01L 21/68785* (2013.01)

(56) References Cited

U.S. PATENT DOCUMENTS

| | | | |
|---|---|---|---|
| 6,306,244 B1* | 10/2001 | Kennedy | C23C 16/45521 156/345.51 |
| 2001/0042514 A1* | 11/2001 | Mizuno | C23C 16/45521 118/728 |
| 2004/0053472 A1 | 3/2004 | Kiryu et al. | |
| 2004/0221808 A1* | 11/2004 | Kawano | C23C 16/4401 118/715 |
| 2006/0280868 A1 | 12/2006 | Kato et al. | |
| 2007/0040265 A1* | 2/2007 | Umotoy | C23C 16/45521 257/704 |
| 2008/0089001 A1* | 4/2008 | Parkhe | H01L 21/6831 279/128 |
| 2010/0323125 A1 | 12/2010 | Tachibana | |
| 2014/0262763 A1* | 9/2014 | Rasheed | C23C 14/34 204/298.11 |
| 2016/0024650 A1* | 1/2016 | Toyoda | C23C 16/45523 118/704 |

FOREIGN PATENT DOCUMENTS

| | | |
|---|---|---|
| JP | 2000-243711 A | 9/2000 |
| JP | 2000-290774 A | 10/2000 |
| JP | 2001-316797 A | 11/2001 |
| JP | 2006-351655 A | 12/2006 |
| JP | 2009-278131 A | 11/2009 |
| JP | 2010-171083 A | 8/2010 |
| JP | 2012-175055 A | 9/2012 |
| JP | 2014-133927 A | 7/2014 |
| WO | WO 2009/104379 A1 | 8/2009 |

OTHER PUBLICATIONS

Office Action dated Apr. 28, 2020, in Japanese Patent Application No. 2016-168994.

* cited by examiner

ATOMIC LAYER DEPOSITION APPARATUS AND ATOMIC LAYER DEPOSITION METHOD

TECHNICAL FIELD

The present invention relates to an atomic layer deposition apparatus and an atomic layer deposition method in which a thin film is formed over, for example, a substrate.

BACKGROUND ART

The atomic layer deposition technique is a technique in which a thin film is formed in a unit of atomic layer over a substrate by alternately supplying gas of an element configuring the thin film to be formed onto the substrate, and is known as a technique for uniformly forming a thin film. In addition, the atomic layer deposition method has advantages such as excellent step coverage and excellent film thickness controllability as compared to the CVD (Chemical-Vapor-Deposition) method.

When a process of forming a thin film is repeatedly performed by the atomic layer deposition method, a thin film is also adhered to an inner wall of a film-forming container. Further, when the thin film adhered to the inner wall of the film-forming container becomes thick, the deposited thin film peels off and a portion thereof becomes particles. Therefore, it is necessary to periodically remove the thin film adhered to the inner wall of the film-forming container.

For example, Japanese Patent Application Laid-Open Publication No. 2006-351655 (Patent Document 1) discloses a processing method and a chemical vapor deposition apparatus which use a deposition prevention plate and in which deposition materials deposited on an inner wall of a chamber are covered by an amorphous film.

In addition, for example, Japanese Patent Application Laid-Open Publication No. 2000-243711 (Patent Document 2) discloses a structure of a substrate processing apparatus in which a side wall cover, a floor cover, an upper cover and a lower cover are removably provided in a reaction chamber and in which inert gas is flowed onto a lower surface of a susceptor.

Further, for example, Japanese Patent Application Laid-Open Publication No. 2001-316797 (Patent Document 3) discloses a technique in which a deposition prevention member is attached to a substrate carrier of a film-forming apparatus such that adhesion of a film onto a surface of the substrate carrier is prevented.

Furthermore, for example, Japanese Patent Application Laid-Open Publication No. 2014-133927 (Patent Document 4) discloses a technique in which a deposition prevention plate is provided in a processing chamber of a plasma processing apparatus such that adhesion of an insulating member to regions other than on a substrate is prevented.

RELATED ART DOCUMENTS

Patent Documents

Patent Document 1: Japanese Patent Application Laid-Open Publication No. 2006-351655
Patent Document 2: Japanese Patent Application Laid-Open Publication No. 2000-243711
Patent Document 3: Japanese Patent Application Laid-Open Publication No. 2001-316797
Patent Document 4: Japanese Patent Application Laid-Open Publication No. 2014-133927

SUMMARY OF THE INVENTION

Problems to be Solved by the Invention

In the film-forming process by the atomic layer deposition method, source gas (such as TMA: Tri-Methyl-Aluminum) used is easily diffused and thus easily enters a small gap in the film-forming container, thereby forming a film. For example, in an atomic layer deposition apparatus in which a film-forming chamber and a transporting chamber are partitioned by a stage stopper and a stage or a susceptor, a gap is formed in the partitioned part which is likely to become a point where particles are generated. That is, the source gas having entered such a small gap becomes a film and powders which cause generation of particles.

Particularly, in a large area type atomic layer deposition apparatus configured to accommodate a large glass substrate, the stage becomes larger as the substrate becomes larger, whereby a flatness of the stage would decrease as the stage becomes larger. As a result, a size of the gap in the partitioned part increases, and generation of particles becomes more conspicuous.

Other problems and novel features will be apparent from the description of the present specification and the attached drawings.

Means for Solving the Problems

An atomic layer deposition apparatus according to one embodiment includes: a film-forming container in which a film-forming process is performed on a substrate; a vertically movable stage provided in the film-forming container; a susceptor held on the stage and being configured to hold the substrate; and a stage stopper configured to stop rising of the stage and, when in contact with the susceptor, partitioning a film-forming space in which the film-forming process is performed and a transporting space in which transport of the substrate is performed. Further, the susceptor has a first susceptor configured to hold the substrate and a second susceptor arranged on a periphery of the first susceptor, wherein a susceptor deposition prevention member is provided on the second susceptor.

In addition, an atomic layer deposition method according to one embodiment includes the steps of: (a) mounting a substrate on a susceptor on a stage; (b) after the step (a), introducing source gas from a gas inlet of a film-forming container into the film-forming container such that the source gas is absorbed onto the substrate; and (c) after the step (b), introducing purge gas from the gas inlet into the film-forming container such that the source gas is discharged outside the film-forming container. The atomic layer deposition method further includes the steps of: (d) after the step (c), introducing reaction gas from the gas inlet into the film-forming container such that the reaction gas is supplied onto the substrate and a desired thin film is formed over a surface of the substrate; and (e) after the step (d), introducing purge gas from the gas inlet into the film-forming container such that the reaction gas is discharged outside the film-forming container, wherein, during the steps (b) to (e), inert gas is flowed in the film-forming container.

Effects of the Invention

According to the above-described embodiment, it is possible to suppress generation of particles in the film-forming container and improve film quality of the thin film formed over the substrate.

DETAILED DESCRIPTION OF PREFERRED EMBODIMENTS

First Embodiment

Configuration of Atomic Layer Deposition Apparatus

A configuration of an atomic layer deposition apparatus 10 of the present embodiment will be described with reference to FIG. 1.

Figure 1:
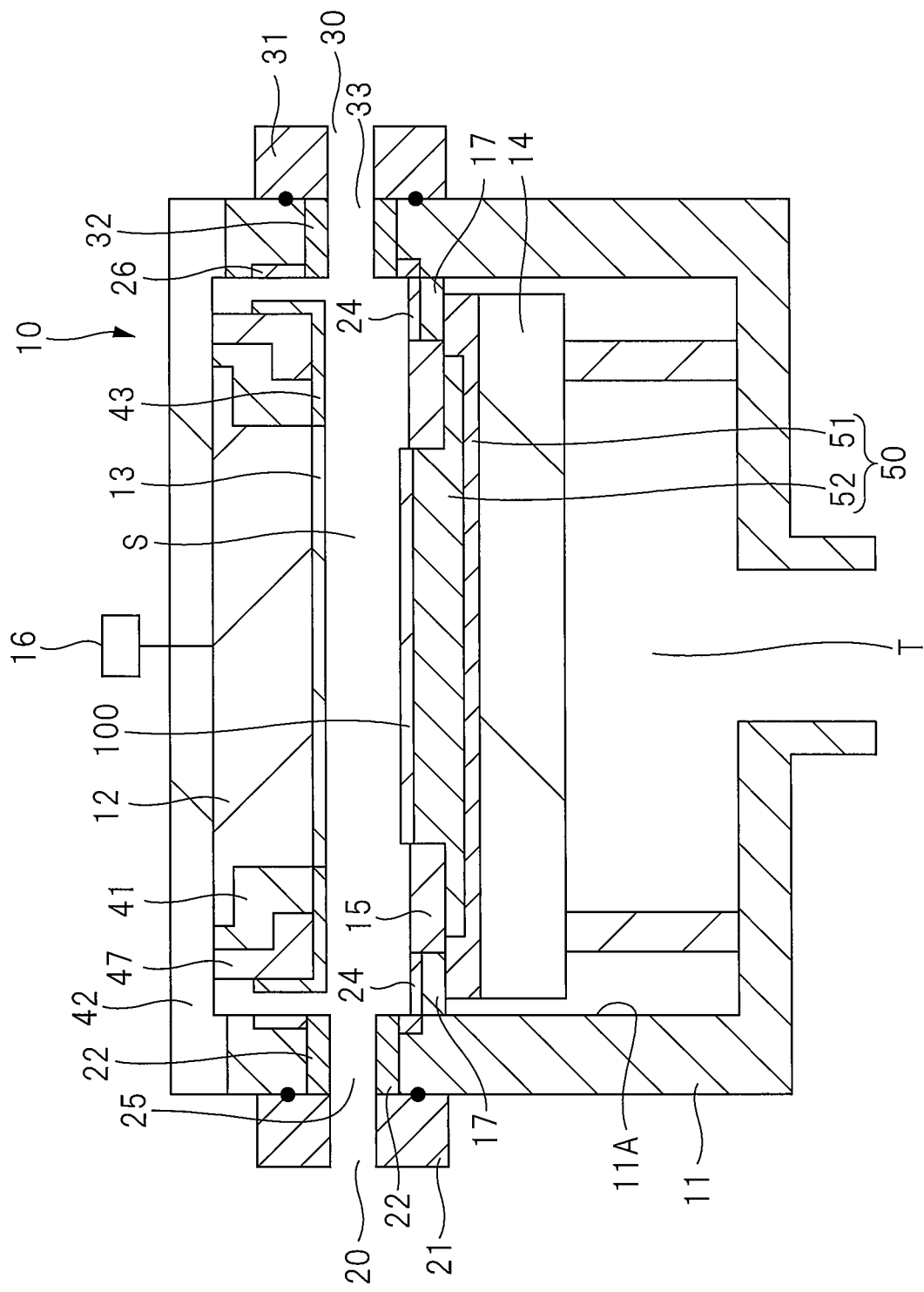
FIG. 1 is a drawing of a schematic configuration showing an example of a structure of an atomic layer deposition apparatus of a first embodiment.

FIG. 1 is a drawing of a schematic configuration showing an example of a structure of the atomic layer deposition apparatus of the present embodiment.

The atomic layer deposition apparatus 10 of a first embodiment is configured to form a thin film in a unit of atomic layer over a substrate 100 by alternately supplying source gas and reaction gas onto the substrate 100. At this time, the substrate 100 can be heated in order to enhance reaction activity. In the first embodiment, TMA (Tri-Methyl-Aluminum) is used as an example of the source gas, and plasma is generated during a film-forming process in order to enhance the reaction activity. A parallel plate electrode is used to generate plasma in the first embodiment; however, the method to generate plasma is not limited thereto.

A film-forming container (also referred to as chamber) 11 provided in the atomic layer deposition apparatus 10 is a container in which the film-forming process is performed on the substrate 100. Further, the film-forming container 11 comprises an injector 21, an outlet flange 31, a plate electrode 12, a stage 14 serving as a counter electrode of the plate electrode 12, a susceptor 50 held on the stage 14 and serving as a substrate holder configured to hold the substrate 100, and a high-frequency power supply 16.

The plate electrode 12 is arranged so as to face the stage 14, is provided above the substrate 100 with a film-forming space S formed therebetween, and is supported by an insulating support 41 arranged on a side of the plate electrode 12. The insulating support 41 is supported by a top-plate supporting portion 47 attached to a top plate 42. Further, an upper insulating deposition prevention member 43 covering the top-plate supporting portion 47 and the insulating support 41 is provided on a peripheral portion of the top-plate supporting portion 47 configured to hold the insulating support 41.

In addition, an end portion of a surface of the plate electrode 12 exposed in a direction of the stage 14 corresponds to an end portion of the plate electrode 12, and a conductive plate electrode deposition prevention member 13 is provided on the plate electrode 12 exposed on a lower surface side.

The stage 14 is configured to hold the substrate 100 and comprises a heater such that a temperature of the substrate 100 can be adjusted to a desired temperature. For example, in a case of an atomic layer deposition process, the substrate 100 is heated to 50° C. to 200° C. At the time of the film-forming process, the film-forming container 11 is maintained in a vacuum state. Further, the high-frequency power supply 16 supplies a high-frequency current at a predetermined frequency to the plate electrode 12.

The stage 14 comprises a vertically movable mechanism, and at the time of the film-forming process, processing is performed when the stage 14 is at the highest elevated position. Further, the conductive susceptor 50 configured to hold the substrate 100 is arranged on the stage 14. Thus, the substrate 100 is held on the susceptor 50, and the high-frequency power supply 16 supplies a high-frequency current at a predetermined frequency to the plate electrode 12, whereby plasma is generated between the plate electrode 12 and the susceptor 50.

Next, a gas inlet 20 to which the source gas, reaction gas and purge gas are introduced will be described. The gas inlet 20 allows the source gas, reaction gas and purge gas to be supplied into the film-forming container 11 in accordance with the process. In addition, the injector 21 is attached to a gas inlet side opening 25 of the film-forming container 11, and an injector deposition prevention member 22 is inserted into the gas inlet side opening 25 from inside the film-forming container 11 and is attached so as to surround the gas inlet side opening 25.

Next, an outlet 30 will be described. The outlet 30 allows the source gas, reaction gas and purge gas to be exhausted from the film-forming container 11 in accordance with the process. The outlet flange 31 is attached to a gas outlet side opening 33 of the film-forming container 11, and an outlet deposition prevention member 32 is inserted into the gas outlet side opening 33 from inside the film-forming container 11 and is attached so as to surround the gas outlet side opening 33. Further, the gas introduced into the film-forming container 11 flows from the gas inlet 20 toward the outlet 30 in accordance with the process. Hereinafter, a direction along a direction of this gas flow will be described as a side direction.

Next, detailed structures of the susceptor 50 and in the vicinity of the susceptor 50 will be described with reference to FIGS. 1 to 3.

Figure 2:
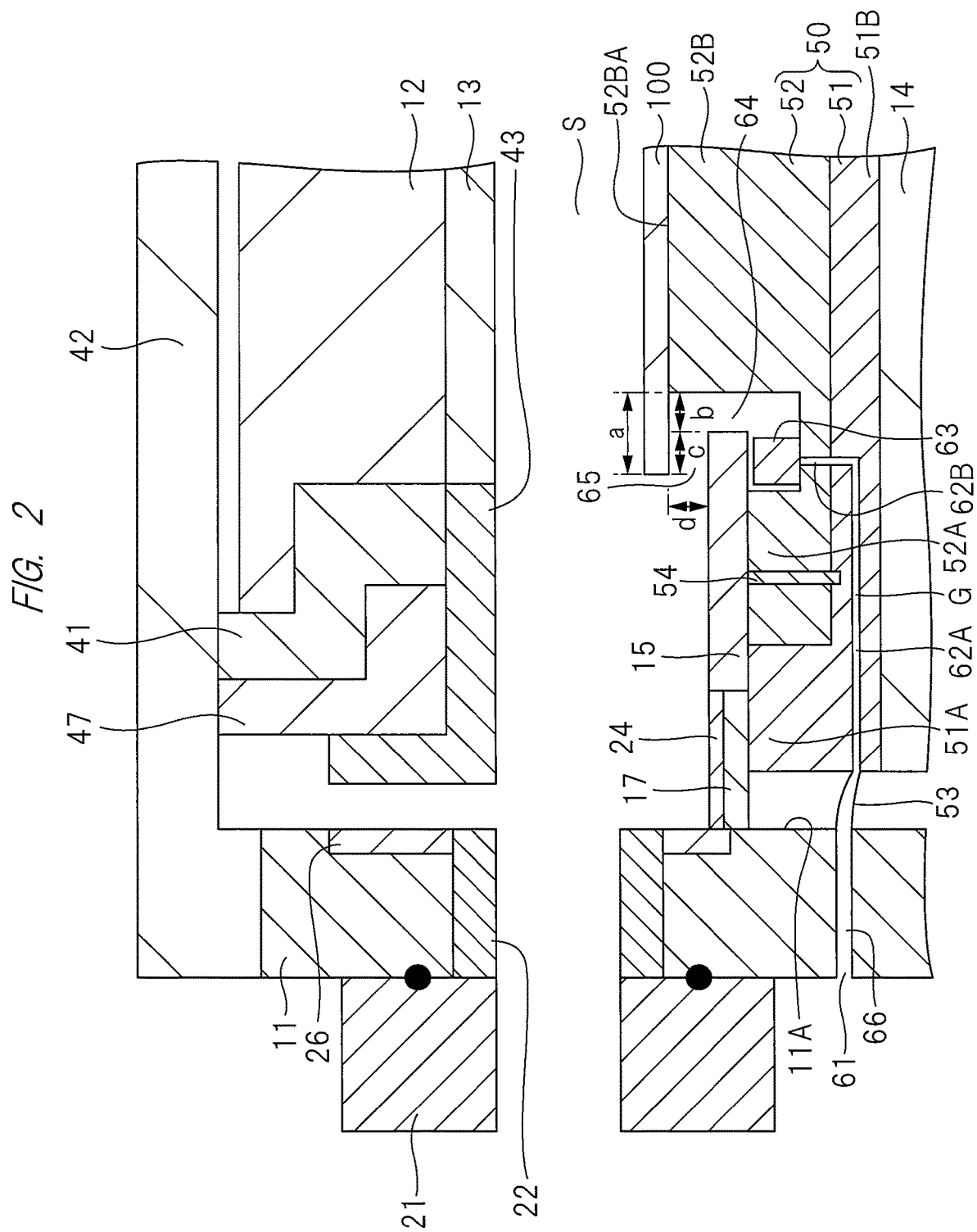
FIG. 2 is an enlarged cross-sectional view showing an example of a main part of an inert gas supply channel of the atomic layer deposition apparatus shown in FIG. 1.
Figure 3:
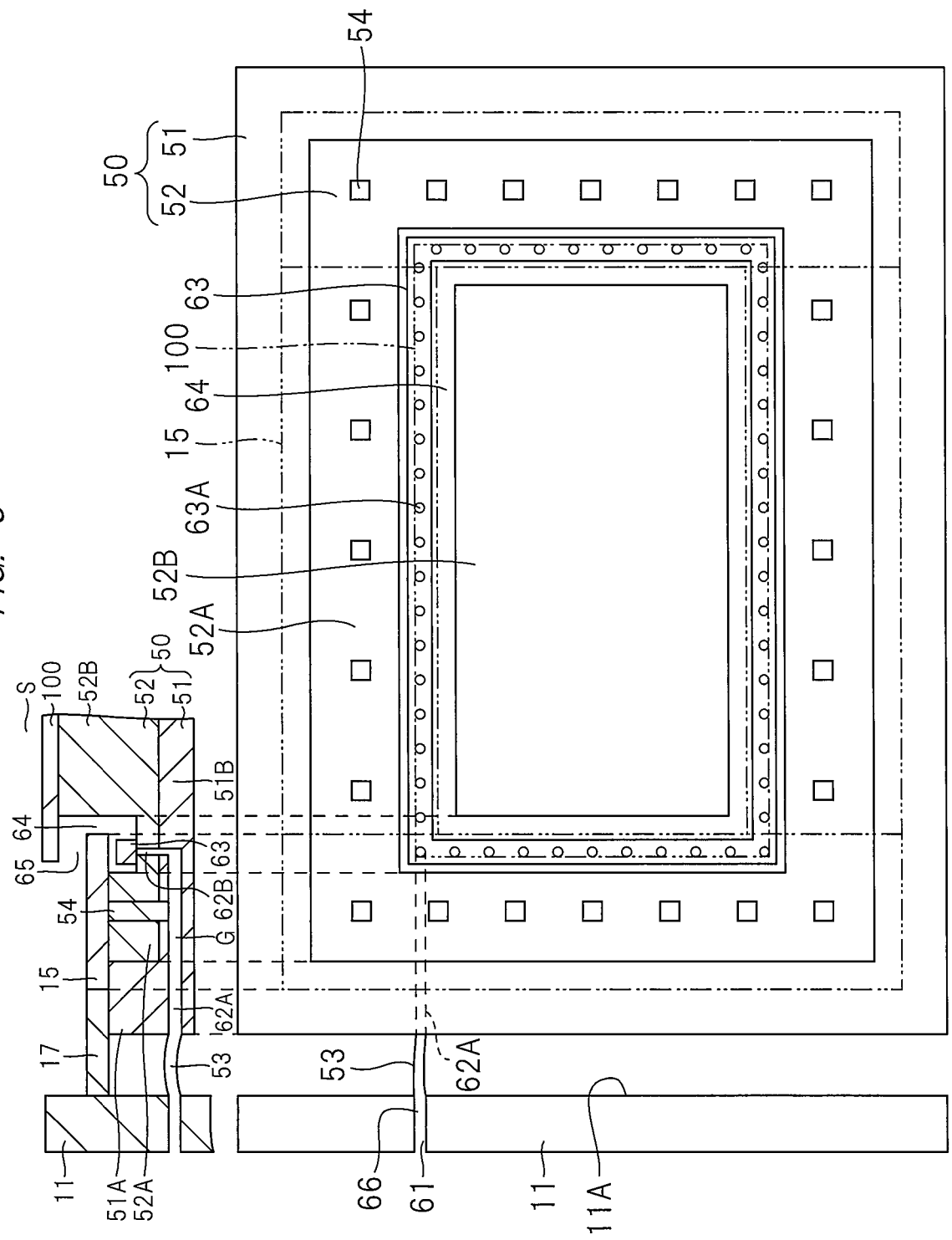
FIG. 3 is a partially enlarged cross-sectional view and an enlarged plan view showing an example of a structure of the inert gas supply channel shown in FIG. 2.

FIG. 2 is an enlarged cross-sectional view showing an example of a main part of the inert gas supply channel of the atomic layer deposition apparatus shown in FIG. 1, and FIG. 3 is a partially enlarged cross-sectional view and an enlarged plan view showing an example of the structure of the inert gas supply channel shown in FIG. 2. Note that FIG. 2 is also an enlarged cross-sectional view of the vicinity of the susceptor 50 when viewed from a holding surface of the injector 21 parallel to the direction of the gas flowing from the gas inlet 20 toward the outlet 30 shown in FIG. 1.

As shown in FIG. 2, in the atomic layer deposition apparatus 10 of the first embodiment, the susceptor 50 is arranged on the stage 14, and the substrate 100 is held by the susceptor 50. The susceptor 50 comprises an upper susceptor 52 configured to hold the substrate 100 and a lower susceptor 51 configured to support the upper susceptor 52. Further, the upper susceptor 52 comprises an upper susceptor substrate holding portion (first susceptor) 52B having a holding surface 52BA configured to hold the substrate 100, and an upper susceptor peripheral portion (second susceptor) 52A positioned in a periphery of the upper susceptor substrate holding portion 52B and being arranged at a lower position than the holding surface 52BA.

In addition, the lower susceptor 51 is supported by the stage 14, and includes a lower susceptor peripheral portion 51A at a lower position than the holding surface 52BA for the substrate 100 and a lower susceptor supporting portion 51B configured to hold the upper susceptor 52. A stage stopper 17 is a member provided so as to be in contact with an inner wall 11A of the four side walls of the film-forming container 11, is configured to stop rising of the stage 14 and, when in contact with the susceptor 50, is configured to partition and form, in the film-forming container 11, the film-forming space S in which the film-forming process is performed and a transporting space T shown in FIG. 1 in which transport of the substrate 100 is performed. Further, the conductive upper susceptor 52 is arranged on the lower susceptor supporting portion 51B and includes the upper susceptor substrate holding portion 52B configured to hold the substrate 100, and the upper susceptor peripheral portion 52A arranged in the periphery of the upper susceptor substrate holding portion 52B and having a surface at a lower position than the upper susceptor substrate holding portion 52B. A susceptor deposition prevention member 15 is provided on at least the upper susceptor peripheral portion 52A, and the susceptor deposition prevention member 15 is provided on a portion of the lower susceptor peripheral portion 51A and the upper susceptor peripheral portion 52A in the atomic layer deposition apparatus 10 of the first embodiment.

In addition, a side surface of the upper susceptor peripheral portion 52A closer to the stage stopper 17 is positioned more inward than a substrate-side side surface of the stage stopper 17, and the upper susceptor 52 and the lower susceptor 51 are fixed to each other by a fixing screw 54 in the upper susceptor peripheral portion 52A.

Here, an inert gas discharge portion 63 configured to supply inert gas is attached to the upper susceptor peripheral portion 52A. As shown in FIG. 3, the inert gas discharge portion 63 is formed in, for example, a frame-like manner so as to surround the upper susceptor substrate holding portion 52B and is provided with a plurality of inert gas supply ports 63A configured to supply the inert gas upward. Further, the inert gas supply ports 63A communicate with a lower inert gas supply channel 62A of the lower susceptor supporting portion 51B.

That is, an inert gas supply channel G configured to supply the inert gas from the outside is provided in the susceptor 50, the inert gas discharge portion 63 is arranged at a position between the upper susceptor substrate holding portion 52B and the upper susceptor peripheral portion 52A, and the inert gas supply port 63A communicating with the inert gas supply channel G is further formed in the inert gas discharge portion 63.

In addition, as shown in FIG. 2, a gap between a side surface of the upper susceptor substrate holding portion 52B and a substrate-side side surface of the susceptor deposition prevention member 15 configures an upper susceptor inert gas supply channel 64, and a gap between a lower surface of the substrate 100 and an upper surface of the susceptor deposition prevention member 15 configures an inert gas discharge port 65. Namely, the inert gas supply channel G configured to supply the inert gas to the film-forming space S via the inert gas discharge port 65 constituted by a gap between the substrate 100 and the susceptor deposition prevention member 15 and via the upper susceptor inert gas supply channel 64 constituted by a gap between the upper susceptor substrate holding portion 52B and the susceptor deposition prevention member 15 is formed in the susceptor 50. Further, an inert gas supply portion 61 configured to supply the inert gas to the inert gas supply channel G of the susceptor 50 is provided in the film-forming container 11.

The inert gas supply channel G formed in the susceptor 50 is constituted by an upper inert gas supply channel 62B formed in the upper susceptor 52 and the lower inert gas supply channel 62A formed in the lower susceptor 51, and the upper inert gas supply channel 62B and the lower inert gas supply channel 62A communicate with each other.

As described above, in the atomic layer deposition apparatus 10 of the first embodiment, the inert gas supply channel G configured to supply the inert gas from outside and being constituted by the upper inert gas supply channel 62B and the lower inert gas supply channel 62A is formed in the susceptor 50. Further, an inert gas vent 66 connected to the film-forming container 11 via the inert gas supply channel G and an inert gas supply tube 53 is formed in the film-forming container 11.

A stage stopper deposition prevention member 24 is provided on an upper surface of the stage stopper 17 provided on the inner wall 11A of the film-forming container 11, and a side wall deposition prevention member 26 is provided on the injector deposition prevention member 22 on the same side as the inner wall 11A.

Here, details of problems of the first embodiment will be described.

In each step of the film-forming process using the atomic layer deposition method, gas of the next reactant is introduced after waiting for the prior gas to be diffused. At this time, the source gas (such as TMA) used is easily diffused, whereby the source gas easily enters a small gap in the film-forming container and forms a film. For example, the source gas or reaction gas enters a small gap formed in the stage 14, the susceptor 50 provided in the film-forming container and members in the periphery of the susceptor 50, whereby film deposition occurs in the small gap. This film deposition causes generation of particles, resulting in a problem in which properties of the thin film formed over the substrate 100 are deteriorated. In order to suppress film deposition, it is necessary to reduce a cross-sectional area of a flow channel which becomes a gas entrance channel, increase a distance of the flow channel, and also allow the inert gas to be purged. However, there may be a case where the structure of the apparatus does not allow reduction of the cross-sectional area of the flow channel which becomes the gas entrance channel or does not allow an increase in the distance of the flow channel. In such a case, it is possible to reduce film deposition but would be difficult to completely avoid film deposition.

In the film-forming apparatus such as a CVD apparatus, excessive film in the chamber is removed by dry etching. Namely, excessive film is removed without disassembling the chamber by flowing a cooling gas (such as $NF_3$) and forming plasma.

However, an alumina ($Al_2O_3$) film used in the atomic layer deposition apparatus is subjected to a high temperature process (for example, at 800° C.) when dry etching is performed, which is costly.

In addition, in the atomic layer deposition apparatus that uses plasma to form an insulating film, the part to be partitioned is insulated by deposition of the film, whereby the amount of the high-frequency current flowed between the susceptor 50 and the stage stopper 17 changes as the film-forming process is repeated, resulting in a problem in which film-forming repeatability is reduced. In addition, the high-frequency current flowed to the susceptor 50 is concentrated in the vicinity of the stage stopper 17, whereby arcing is likely to occur in a portion where a gap or unevennesses are present. Thus, it is necessary to minimize the number of joints and screws for the deposition prevention plate which become a source of arcing.

In addition, the number of deposition prevention plates increases as the atomic layer deposition apparatus becomes larger, resulting in a problem in which time required for maintenance increases. Maintenance of the film-forming container 11 is performed by releasing the top plate 42 of the film-forming container 11 and reaching into the film-forming space S from above the film-forming container 11; however, access to the deposition prevention plates of the side surface of the stage stopper 17 and in the vicinity of the susceptor at the time of maintenance is difficult, whereby maintenance workability becomes very poor.

Thus, it is desired that the deposition prevention plate in the vicinity of the susceptor 50 of the atomic layer deposition apparatus has a structure in which film deposition to regions other than the surface of the deposition prevention plate is suppressed and in which the deposition prevention plate can be easily attached and removed.

In the atomic layer deposition apparatus 10 of the first embodiment, the susceptor deposition prevention member 15 is provided on the lower susceptor peripheral portion 51A and the upper susceptor peripheral portion 52A in a region inside the stage stopper 17.

Next, a detailed structure of the periphery of the susceptor 50 will be further described.

In the atomic layer deposition apparatus 10, a distance (distance a) between the side surface of the upper susceptor substrate holding portion 52B and a side surface of the substrate 100 is preferably greater than or equal to 0.1 mm and less than or equal to 10 mm. By making the distance a large, entry of the source gas and reaction gas into the inert gas discharge port 65 is suppressed, whereby film deposition on the upper susceptor substrate holding portion 52B can be reduced. However, in a case where the distance a is too large, a size of a region in which an outer peripheral portion of the substrate 100 does not come in contact with the upper susceptor substrate holding portion 52B increases, whereby the temperature of the outer peripheral portion of the substrate 100 is caused to decrease. Since edge exclusion of the substrate 100 is typically set to 5 mm, a suitable value of the distance a in the first embodiment is set to 5 mm.

In addition, the gap (distance b) between the side surface of the upper susceptor substrate holding portion 52B and the substrate-side side surface of the susceptor deposition prevention member 15 is preferably greater than or equal to 0.1 mm and less than or equal to 10 mm. By making the distance b small, entry of the source gas and reaction gas into the upper susceptor inert gas supply channel 64 is suppressed, whereby film deposition on the upper susceptor substrate holding portion 52B and the upper susceptor peripheral portion 52A is reduced. In a case where a value of the distance b is too small, the side surface of the upper susceptor substrate holding portion 52B and the susceptor deposition prevention member 15 may interfere with each other depending on assembly accuracy. Thus, a suitable value for the distance b is necessary, and in the first embodiment, the distance b is set to 0.5 mm.

In addition, an overlapping distance (distance c) of the substrate 100 and the susceptor deposition prevention member 15 in a horizontal direction is preferably greater than or equal to 0.1 mm and less than or equal to 10 mm. By making the distance c large, entry of the source gas and reaction gas into the inert gas discharge port 65 is suppressed. However, in a case where the value of the distance b is small, the side surface of the upper susceptor substrate holding portion 52B and the susceptor deposition prevention member 15 may interfere with each other depending on assembly accuracy. At this time, the distance c is determined by the suitable values of the distances a and b, and thus, in the first embodiment, the distance c is set to 4.5 mm.

In addition, the gap (distance d) between the lower surface of the substrate 100 and the upper surface of the susceptor deposition prevention member 15 is preferably greater than or equal to 0.1 mm and less than or equal to 10 mm. By making the distance d small, entry of the source gas and reaction gas into the inert gas discharge port 65 is suppressed. In a case where a value of the distance d is too small, the substrate 100 and the susceptor deposition prevention member 15 may interfere with each other depending on assembly accuracy. Thus, a suitable value for the distance d is necessary, and in the first embodiment, the distance d is set to 1 mm.

The upper susceptor peripheral portion 52A includes the upper inert gas supply channel 62B communicating with the inert gas supply port 63A, and a terminal end of the upper inert gas supply channel 62B is connected to the lower inert gas supply channel 62A provided in the lower susceptor 51. The lower inert gas supply channel 62A and the upper inert gas supply channel 62B form a through hole in the lower susceptor 51 and the upper susceptor 52, and the inert gas can be supplied to the inert gas supply port 63A by interposing, for example, an O-ring therebetween. The inert gas supply tube 53 arranged on an outer peripheral side of the lower susceptor 51 is connected to the lower inert gas supply channel 62A, and the other end of the inert gas supply tube 53 is connected to the inert gas vent 66 provided in the film-forming container 11. Further, the inert gas supply portion 61 provided outside the film-forming container 11 is connected to the inert gas vent 66.

The inert gas supply tube 53 can be constituted by, for example, a stainless steel tube, a bellows type flexible tube or the like. When the substrate 100 is transported into or out from the film-forming container 11, the stage 14 is vertically moved, and it is necessary for the inert gas supply tube 53 to also follow this vertical movement. The inert gas supply tube 53 also partially configures the inert gas supply channel.

As shown in FIG. 3, the inert gas is preferably shower-fed from an entire periphery of each of the upper susceptor inert gas supply channel 64 and inert gas discharge port 65 by the inert gas supply port 63A of the inert gas discharge portion 63. A single inert gas supply portion 61 is provided in FIG. 3; however, it is preferable to provide a plurality of inert gas supply portions 61. A plurality of inert gas discharge ports 65 may be formed along an entire periphery of the vicinity of the upper susceptor substrate holding portion 52B, or the inert gas discharge port 65 may be continuously formed along the entire periphery of the vicinity of the upper susceptor substrate holding portion 52B.

In addition, a shower hole in each of the inert gas supply ports 63A has a diameter that preferably falls within a range of 1 mm to 3 mm, where a diameter of approximately 1 mm is sufficient. A pitch between the shower holes is preferably 10 mm to 200 mm. The shower hole may be formed by providing a through hole in the upper susceptor peripheral portion 52A, or a shower plate may be individually formed and attached to the upper susceptor peripheral portion 52A.

In addition, the lower susceptor 51 and the upper susceptor 52 may be fixed to each other by using, for example, a screw. Here, a position of the fixing screw 54 is preferably in a portion of the upper susceptor peripheral portion 52A. In a case where the fixing screw 54 is present in the upper susceptor substrate holding portion 52B, it is possible for its screw head to interfere with the substrate 100. In addition, in a case where the screw head is present at a lower position than an upper surface of the upper susceptor substrate holding portion 52B, the portion of the upper susceptor substrate holding portion 52B where the screw head is present cannot come into contact with the substrate 100, whereby the temperature is caused to decrease locally.

As shown in FIG. 2, in the inert gas discharge port 65 of the first embodiment, the value of the distance (distance a) between the side surface of the upper susceptor substrate holding portion 52B and the side surface of the substrate 100 configuring the inert gas discharge port 65 is set to 5 mm, considering deterioration of temperature uniformity of the substrate 100. Further, the value of the gap (distance d) between the lower surface of the substrate 100 and the upper surface of the susceptor deposition prevention member 15 is set to 1 mm, considering interference of the substrate 100 and the susceptor deposition prevention member 15. However, it is possible that a flow channel width and a flow channel length are not sufficient for suppressing entry of the source gas and reaction gas.

By increasing a supply amount of the inert gas, entry of the source gas and reaction gas into the inert gas discharge port 65 can be reduced; however, increasing the flow rate affects gas uniformity of the source gas and reaction gas and may deteriorate uniformity of the film thickness and uniformity of the film quality.

Since it is highly possible that completely suppressing generation of powders in the gaps and completely suppressing film deposition on the upper susceptor substrate holding portion 52B are difficult, it is preferable that the upper susceptor 52 has a structure that allows the upper susceptor 52 to be easily attached and removed.

Thus, it is preferable that an end surface (side surface) of an outer peripheral portion of the upper susceptor peripheral portion 52A is in the film-forming space S at a position more inward than a substrate-side end surface (side surface) of the stage stopper 17. The stage stopper 17 is completely fixed to the film-forming container 11 and may be difficult to attach or remove; however, as long as the upper susceptor 52 has a smaller size than the stage stopper 17, the upper susceptor 52 can be easily removed upward without removing the stage stopper 17, whereby maintainability of the film-forming container 11 can be improved.

After the inert gas is heated to a temperature within ±10% of a surface temperature of the stage 14, it is preferable that the inert gas is discharged from the inert gas supply port 63A and is further discharged via the inert gas discharge port 65. For example, when the inert gas is supplied at room temperature in a case where the stage is to be heated to 100° C., an outer periphery of each of the lower susceptor 51 and upper susceptor 52 is cooled, whereby temperature distribution of the substrate 100 is reduced and uniformity of the film thickness and uniformity of the film quality is deteriorated. In order to maintain the temperatures of the lower susceptor 51 and upper susceptor 52 constant, it is thus preferable to supply the inert gas at, for example, 90° C. to 110° C.

According to the atomic layer deposition apparatus 10 of the first embodiment, the susceptor deposition prevention member 15 is provided on the susceptor 50 arranged on the stage 14, whereby film deposition on the susceptor 50 can be suppressed.

Specifically, the susceptor deposition prevention member 15 is provided on an upper surface of the upper susceptor peripheral portion 52A of the upper susceptor 52 configured to hold the substrate 100 and on an upper surface of the lower susceptor peripheral portion 51A of the lower susceptor 51, whereby film deposition on the upper susceptor peripheral portion 52A and the lower susceptor peripheral portion 51A and film deposition in a gap between the upper susceptor peripheral portion 52A and the lower susceptor peripheral portion 51A can be suppressed.

Particularly, the source gas such as TMA used in the atomic layer deposition apparatus 10 has a strong diffusibility, whereby the source gas can easily enter various gaps in the film-forming container 11; however, since the susceptor 50 is covered by the susceptor deposition prevention member 15, entry of the source gas into the gaps of the susceptor 50 and in the vicinity of the susceptor 50 can be prevented. As a result, generation of particles formed by the thin film, powders and the like can be suppressed.

In this manner, generation of particles in the film-forming container 11 is suppressed, whereby film quality of the thin film formed over the substrate 100 can be improved.

In addition, by arranging the side surface of the upper susceptor peripheral portion 52A of the upper susceptor 52 at a position more inward than a position of the substrate-side side surface of the stage stopper 17, the upper susceptor 52 can be easily attached and removed. As a result, maintenance workability of the film-forming container 11 and the upper susceptor 52 can be improved.

In addition, by forming the inert gas supply channel G constituted by the lower inert gas supply channel 62A and the upper inert gas supply channel 62B in the susceptor 50, the inert gas can be flowed in the gap between the susceptor deposition prevention member 15 and the upper susceptor substrate holding portion 52B and the gap between the substrate 100 and the susceptor deposition prevention member 15 at the time of the film-forming process.

In this manner, entry of the source gas into the vicinity of the side surface of the susceptor deposition prevention member 15 can be prevented, whereby film deposition on the susceptor 50 can be suppressed. As a result, frequency of maintenance of the film-forming container 11 is reduced, whereby an operation rate of the atomic layer deposition apparatus 10 can be improved.

In addition, by forming the inert gas supply channel G in the susceptor 50, manufacturing cost can be reduced as compared to a case where the inert gas supply channel is formed in the stage 14. Further, designing the stage 14 would be difficult in a case where the inert gas supply channel is formed in the stage 14, whereas designing the stage 14 is easier when the inert gas supply channel is formed in the susceptor 50. In addition, a degree of freedom can be increased when the inert gas supply channel is formed in the susceptor 50 as compared to a case where the channel is formed in the stage 14.

Atomic Layer Deposition Method

Next, a procedure (atomic layer deposition method) of the thin film-forming process using the atomic layer deposition apparatus 10 will be described.

Figure 4:
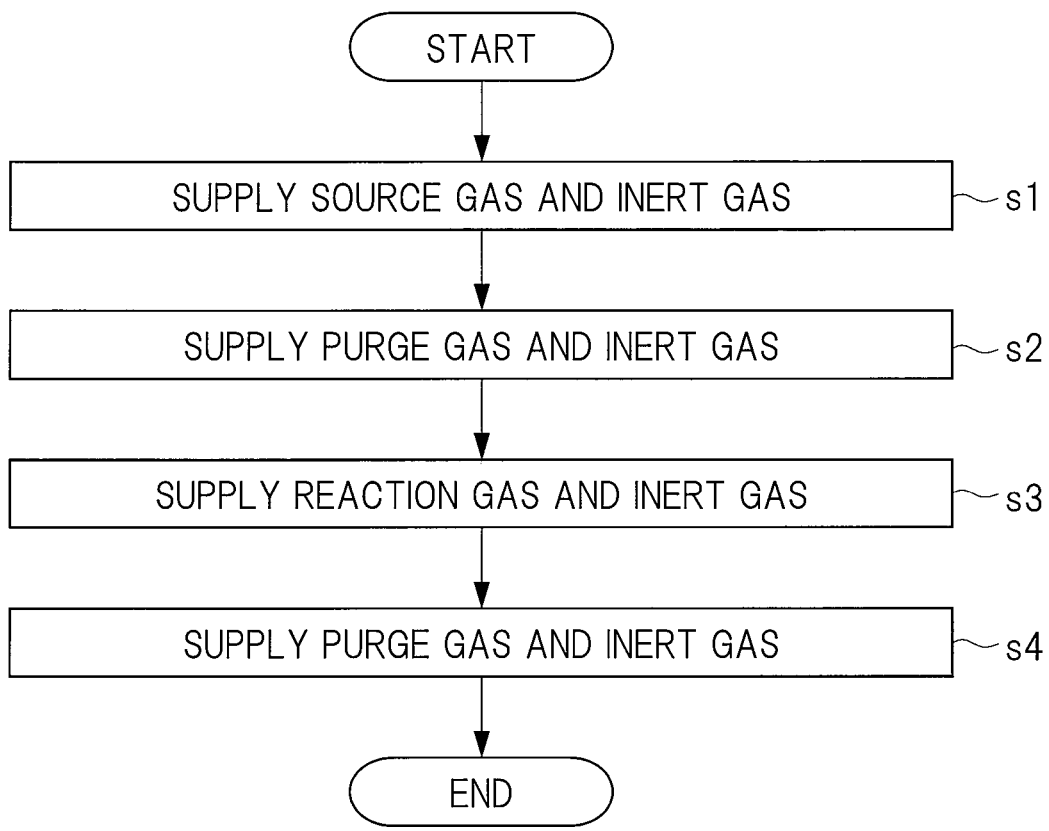
FIG. 4 is a flowchart showing an example of an atomic layer deposition method of the first embodiment.

FIG. 4 is a flowchart showing an example of the atomic layer deposition method of the present embodiment, and FIGS. 5(a) to 5(d) are cross-sectional views showing an example of the substrate in the procedure of the thin film-forming process according to the flowchart shown in FIG. 4.

First, the substrate 100 is mounted on the stage 14 provided in the film-forming container 11 shown in FIG. 1.

Next, a source gas supply unit supplies the source gas into the film-forming container 11 (step s1 shown in FIG. 4). Specifically, the source gas is supplied to the gas inlet 20 of the film-forming container 11 shown in FIG. 1 (step s1). The source gas is, for example, TMA and is supplied into the film-forming container 11. The source gas is supplied into the film-forming container 11 for, for example, 0.1 seconds. As shown in FIG. 5(a), in step s1, the source gas 110 is supplied into the film-forming container 11 and is absorbed onto the substrate 100, whereby an absorption layer 102 is formed.

In addition, in step s1, inert gas F such as nitrogen is supplied from the inert gas supply portion 61 shown in FIG. 2 into the film-forming container 11 shown in FIG. 1. Specifically, the inert gas is supplied to the film-forming space S via the inert gas supply channel G formed in the susceptor 50. In the first embodiment, the inert gas F is constantly supplied into the film-forming container 11 not only during step s1 but also during steps s2 to s4 described below. In this manner, entry of the source gas and reaction gas into the gap between the substrate 100 and the susceptor deposition prevention member 15 and the gap between the upper susceptor substrate holding portion 52B and the susceptor deposition prevention member 15 can be reduced, whereby film deposition in each of the gaps can be suppressed.

Next, supplying of the source gas 110 is stopped, and the purge gas is supplied from the gas inlet 20 (step s2 shown in FIG. 4). The purge gas is supplied into the film-forming container 11. The source gas 110 is discharged outside the film-forming container 11 from the outlet 30 of the film-forming container 11.

The purge gas is supplied into the film-forming container 11 for, for example, 0.1 seconds. Further, the outlet 30 allows the source gas 110 and purge gas 112 in the film-forming container 11 to be exhausted. The outlet 30 allows the source gas 110 and purge gas 112 in the film-forming container 11 to be exhausted for, for example, 2 seconds. As shown in FIG. 5(b), in step s2, the purge gas 112 is supplied into the film-forming container 11, whereby the source gas 110 not absorbed onto the substrate 100 is purged from the film-forming container 11. At this time, the inert gas F is also supplied from the inert gas supply portion 61.

Next, the reaction gas is supplied into the film-forming container 11 (step s3 shown in FIG. 4). Specifically, the reaction gas is supplied through the gas inlet 20 (step s3). The reaction gas passes through a channel of the gas inlet 20 and is supplied into the film-forming container 11. The reaction gas is supplied into the film-forming container 11 for, for example, 1 second. As shown in FIG. 5(c), in step s3, reaction gas 114 is supplied into the film-forming container 11, whereby a desired thin layer 104 is formed over the surface of the substrate 100. The thin layer 104 is, for example, an organic EL protective film. In addition, the inert gas F is supplied from the inert gas supply portion 61 also during step s3.

Next, supplying of the reaction gas is stopped, and the purge gas is supplied to the gas inlet 20 (step s4 shown in FIG. 4). The purge gas 112 is supplied into the film-forming container 11. The purge gas 112 is discharged outside the film-forming container 11 from the outlet 30. The purge gas is supplied into the film-forming container 11 for, for example, 0.1 seconds. The outlet 30 allows the reaction gas 114 and purge gas 112 in the film-forming container 11 to be exhausted outside the film-forming container 11. As shown in FIG. 5(d), in step s4, the purge gas 112 is supplied into the film-forming container 11, whereby the reaction gas 114 is purged from the film-forming container 11. At this time, the inert gas F is also supplied from the inert gas supply portion 61.

By performing steps s1 to s4 described above, the thin layer 104 having a single atomic layer is formed over the substrate 100. Thereafter, steps s1 to s4 are repeated a predetermined number of times such that the thin layer 104 having a desired film thickness can be formed.

As described above, in the atomic layer deposition apparatus 10 of the first embodiment, the inert gas F is supplied (introduced) from the inert gas supply portion 61 into the film-forming container 11 via the inert gas supply channel G formed in the susceptor 50 during the film-forming process (during steps s1 to s4). In this manner, the inert gas F is supplied to a side portion of the susceptor 50 and the film-forming space S above the stage 14.

More specifically, as shown in FIG. 2, the inert gas is supplied from the inert gas supply portion 61 and the inert gas F is flowed in the gap between the substrate 100 and the susceptor deposition prevention member 15 and the gap between the upper susceptor substrate holding portion 52B and the susceptor deposition prevention member 15 during the film-forming process, whereby the amount of film deposition on the upper susceptor substrate holding portion 52B can be reduced. As a result, frequency of cleaning the inside of the film-forming container 11 by wet etching can be reduced.

In addition, in the atomic layer deposition method of the first embodiment, the inert gas F is continuously flowed in the gap between the substrate 100 and the susceptor deposition prevention member 15 and the gap between the upper susceptor substrate holding portion 52B and the susceptor deposition prevention member 15 during the film-forming process.

In this manner, a constant pressure can be constantly maintained in the film-forming container 11 during the film-forming process. Particles are likely to generate when the pressure in the film-forming container 11 fluctuates, whereby film quality of the thin film formed over the substrate 100 deteriorates; however, in the atomic layer deposition method of the first embodiment, the inert gas F is continuously flowed during the film-forming process, whereby the pressure in the film-forming container 11 can be constantly maintained and generation of particles can be reduced.

As a result, film quality of the thin film formed over the substrate 100 can be improved.

In addition, by flowing the inert gas F in each of the gaps, entry of the source gas 110 and reaction gas 114 into each of the gaps can be prevented, whereby film deposition on the stage stopper 17 and each of the gaps can be suppressed.

Here, a result of an evaluation performed on formation of an AlON thin film over a large area glass substrate having a size of 370 mm×470 mm by using the atomic layer deposition apparatus 10 according to the first embodiment will be described. Values for the atomic layer deposition apparatus 10 were set to the following.

Distance a: 5 mm, distance b: 0.5 mm, distance c: 4.5 mm, distance d: 1 mm, diameter of shower hole: 1 mm, pitch between shower holes: 100 mm, stage temperature: 100° C., inert gas temperature: 100° C., and inert gas flow rate: 500 sccm.

In addition, TMA was used as a liquid source (source gas, Al source), and oxygen plasma and nitrogen plasma were used as the reaction gas. Film-forming was performed according to the sequence shown in FIG. 4. The pressure in the film-forming container 11 was set to 100 Pa, 1000 sccm of nitrogen was supplied from the upper inert gas supply channel 62B and the lower inert gas supply channel 62A as the inert gas F, and the inert gas F was constantly supplied during the film-forming sequence.

After the film-forming process was performed such that the film thickness in the film-forming container 11 was 20 μm, film deposition of 200 nm on the upper susceptor substrate holding portion 52B was observed; however, no generation of powders was observed. In a case where a 2 μm film is deposited on the susceptor 50 of the first embodiment, it is known that particles are generated by the susceptor 50 depending on the material used and the film quality of the deposited film.

Rectified Under Rule 91, 26 Sep. 2017

In an atomic layer deposition apparatus in which the inert gas is not supplied into the film-forming container during the film-forming process, generation of powders was observed when the film thickness in the film-forming container reached 20 μm, and it was necessary to perform maintenance after disassembling the stage stopper every time this was observed. In contrast, the atomic layer deposition apparatus 10 of the first embodiment can be free of maintenance until the film thickness in the film-forming container 11 reaches 200 μm which is ten times the film thickness of the atomic layer deposition apparatus in which the inert gas is not supplied.

Further, it was confirmed that maintainability can be significantly improved since the upper susceptor 52 can be easily attached and removed at the time of maintenance.

Second Embodiment

Configuration of Atomic Layer Deposition Apparatus

Figure 6:
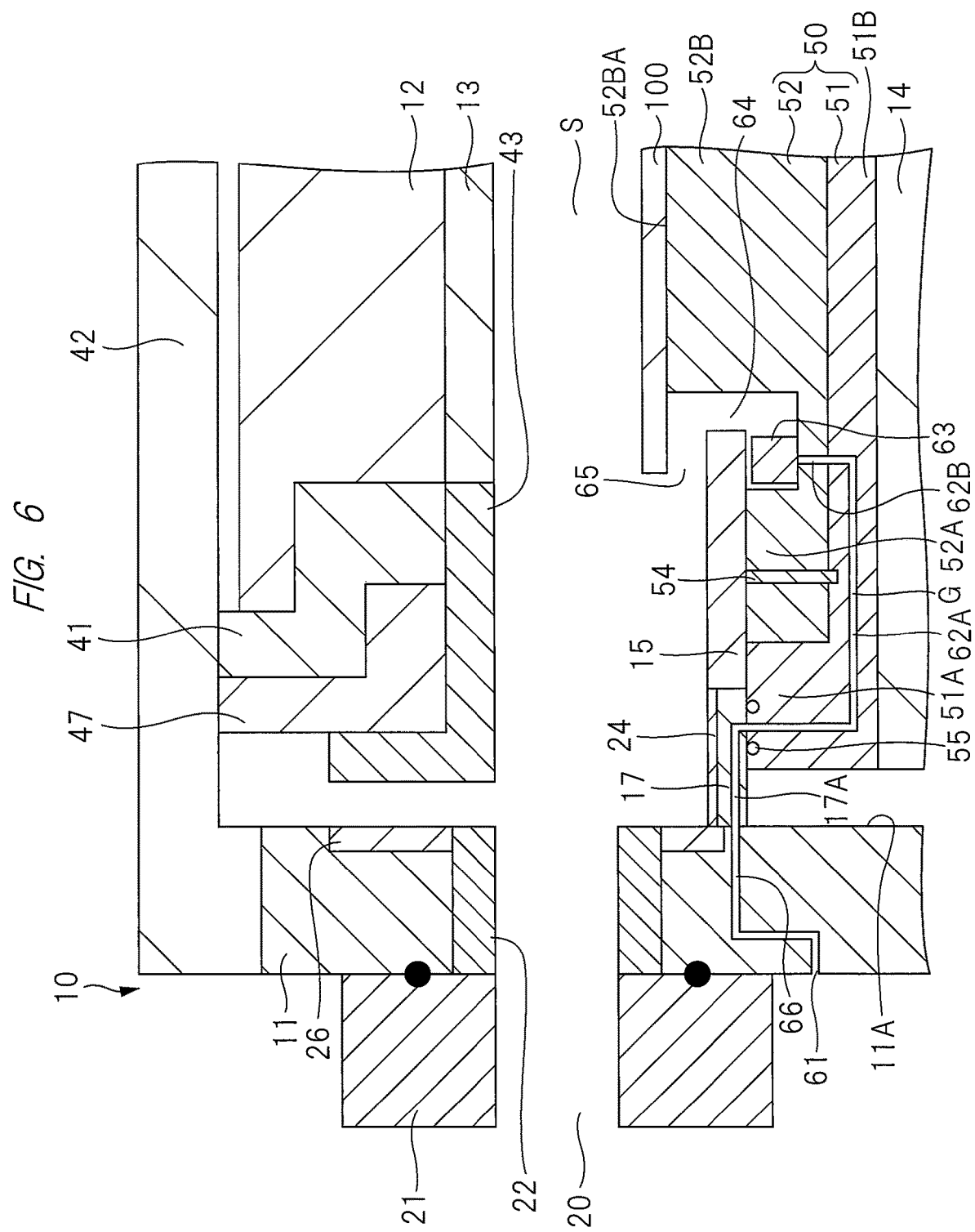
FIG. 6 is an enlarged cross-sectional view showing an example of a structure of a main part of an atomic layer deposition apparatus of a second embodiment.
Figure 7:
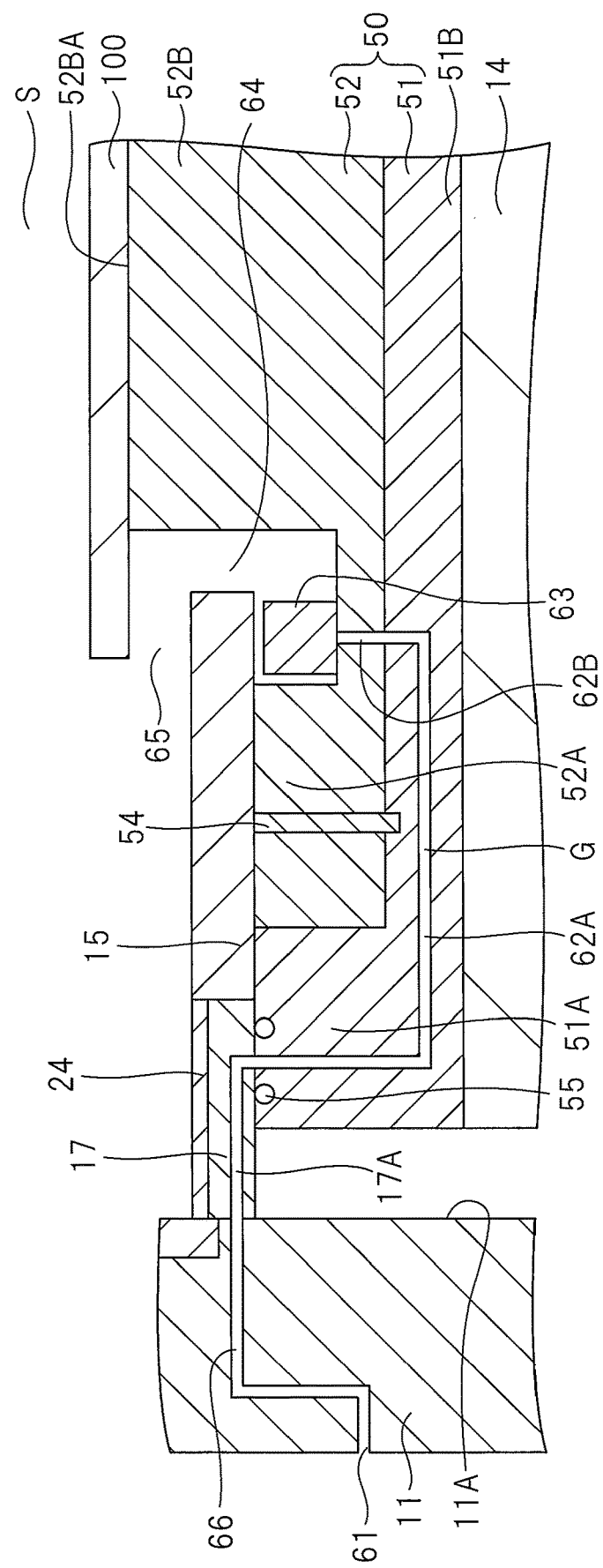
FIG. 7 is an enlarged cross-sectional view showing an example of a main part of an inert gas supply channel of the atomic layer deposition apparatus shown in FIG. 6.

FIG. 6 is an enlarged cross-sectional view showing an example of a structure of a main part of the atomic layer deposition apparatus of a second embodiment, and FIG. 7 is an enlarged cross-sectional view showing an example of a main part of the inert gas supply channel of the atomic layer deposition apparatus shown in FIG. 6.

In the atomic layer deposition apparatus 10 of the second embodiment, an inert gas supply channel connecting the inert gas supply channel formed in the lower susceptor 51 (lower susceptor supporting portion 51B) and the inert gas vent 66 formed in the film-forming container 11 is formed in the stage stopper 17.

Here, features of the structure of the main part of the atomic layer deposition apparatus 10 of the second embodiment will be described with reference to FIGS. 6 and 7. As in the atomic layer deposition apparatus 10 of the first embodiment, the susceptor 50 comprises the upper susceptor substrate holding portion (first susceptor) 52B configured to hold the substrate 100, and the upper susceptor peripheral portion (second susceptor) 52A arranged on the periphery of the upper susceptor substrate holding portion 52B. Further, the susceptor deposition prevention member 15 is provided so as to extend over the upper susceptor peripheral portion 52A and a portion of the lower susceptor peripheral portion 51A.

Further, a stage stopper gas supply channel 17A serving as an inert gas supply channel communicating with the lower inert gas supply channel 62A formed in the lower susceptor supporting portion 51B is formed in the stage stopper 17, and the inert gas is supplied to the film-forming space S via the lower inert gas supply channel 62A of the lower susceptor 51 and via the stage stopper gas supply channel 17A serving as the inert gas supply channel of the stage stopper 17 during the film-forming process.

Namely, as shown in FIG. 7, in the atomic layer deposition apparatus 10 of the second embodiment, the lower inert gas supply channel 62A formed in the lower susceptor 51 is connected to the stage stopper gas supply channel 17A formed in the stage stopper 17, and the stage stopper gas supply channel 17A further communicates with the inert gas vent 66 of the film-forming container 11. Therefore, the inert gas supplied from the inert gas supply portion 61 of the film-forming container 11 is supplied to the film-forming space S via the stage stopper gas supply channel 17A of the stage stopper 17 and via the lower inert gas supply channel 62A of the lower susceptor 51.

In addition, the upper susceptor peripheral portion 52A and the lower susceptor supporting portion 51B are fixed to each other by the fixing screw 54 at a position between the substrate-side side surface of the stage stopper 17 and an end portion of the substrate 100. More specifically, the upper susceptor peripheral portion 52A is arranged at a position between the substrate-side side surface of the stage stopper 17 and the side surface of the upper susceptor substrate holding portion 52B just below the substrate, and the upper susceptor peripheral portion 52A and the lower susceptor supporting portion 51B are fixed to each other by the fixing screw 54 at the position between the substrate-side side surface of the stage stopper 17 and the side surface of the upper susceptor substrate holding portion 52B just below the substrate 100.

In addition, in a case where the atomic layer deposition apparatus 10 is configured to perform the film-forming process by using plasma, the conductive susceptor 50 (lower susceptor peripheral portion 51A) and the stage stopper 17 are electrically connected to each other via a metal O-ring 55. That is, the plate electrode 12 is arranged at a position facing the stage 14, the stage 14 and the susceptor 50 are electrically connected to each other, and the metal O-ring 55 is provided at a contact portion between the lower susceptor peripheral portion 51A of the lower susceptor 51 and the stage stopper 17. In this manner, the stage stopper 17 and the lower susceptor peripheral portion 51A are electrically connected to each other via the metal O-ring 55.

Other structures of the atomic layer deposition apparatus 10 of the second embodiment are the same as those of the atomic layer deposition apparatus 10 of the first embodiment, and thus, redundant descriptions thereof are omitted.

Atomic Layer Deposition Method

The film-forming process is performed by using the atomic layer deposition apparatus 10 comprising the above-described main structure.

Figure 5:
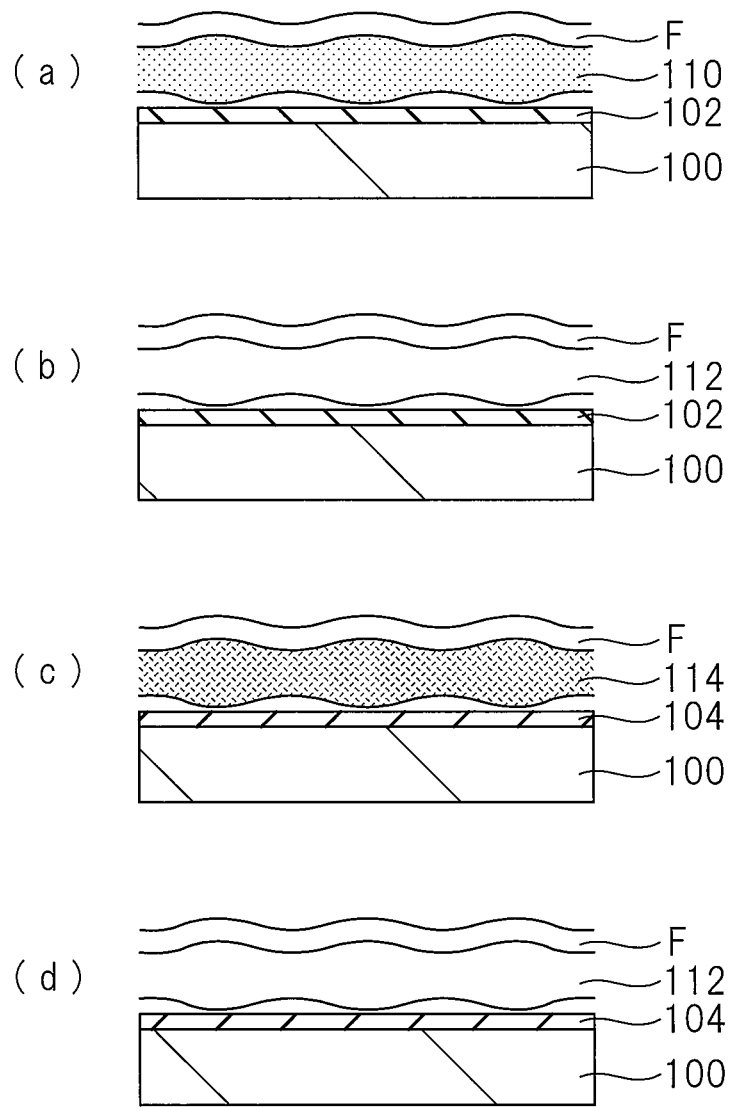
FIGS. 5(a) to 5(d) are cross-sectional views showing an example of a substrate in a procedure of a thin-film forming process according to the flowchart shown in FIG. 4.

Note that the procedure of the film-forming process is the same as the procedure (atomic layer deposition method) of the first embodiment described with reference to FIGS. 4 and 5.

First, the substrate 100 is mounted on the stage 14 provided in the film-forming container 11 shown in FIG. 6.

Next, the source gas supply unit supplies the source gas into the film-forming container 11 (step s1 shown in FIG. 4). Specifically, the source gas is supplied to the gas inlet 20 of the film-forming container 11 shown in FIG. 6 (step s1). The source gas is, for example, TMA and is supplied into the film-forming container 11. The source gas is supplied into the film-forming container 11 for, for example, 0.1 seconds. As shown in FIG. 5(a), in step s1, the source gas 110 is supplied into the film-forming container 11 and is absorbed onto the substrate 100, whereby the absorption layer 102 is formed.

In addition, in step s1, the inert gas F such as nitrogen is supplied from the inert gas supply portion 61 shown in FIG. 7 into the film-forming container 11 via the stage stopper gas supply channel 17A of the stage stopper 17. In the second embodiment, the inert gas F is constantly supplied into the film-forming container 11 not only during step s1 but also during steps s2 to s4 described below. In this manner, entry of the source gas into the gap between the substrate 100 and the susceptor deposition prevention member 15 and the gap between the upper susceptor substrate holding portion 52B and the susceptor deposition prevention member 15 can be reduced, whereby film deposition in each of the gaps can be suppressed.

Next, supplying of the source gas 110 is stopped, and the purge gas is supplied from the gas inlet 20 (step s2 shown in FIG. 4). The purge gas is supplied into the film-forming container 11. The source gas 110 is discharged outside the film-forming container 11 from the outlet 30 (see FIG. 1) of the film-forming container 11.

The purge gas is supplied into the film-forming container 11 for, for example, 0.1 seconds. Further, the outlet 30 allows the source gas 110 and purge gas 112 in the film-forming container 11 to be exhausted. The outlet 30 allows the source gas 110 and purge gas 112 in the film-forming container 11 to be exhausted for, for example, 2 seconds. As shown in FIG. 5(b), in step s2, the purge gas 112 is supplied into the film-forming container 11, whereby the source gas 110 not absorbed onto the substrate 100 is purged from the film-forming container 11. At this time, the inert gas F is also supplied from the inert gas supply portion 61.

Next, the reaction gas is supplied into the film-forming container 11 (step s3 shown in FIG. 4). Specifically, the reaction gas is supplied through the gas inlet 20 (step s3). The reaction gas passes through the channel of the gas inlet 20 and is supplied into the film-forming container 11. The reaction gas is supplied into the film-forming container 11 for, for example, 1 second. As shown in FIG. 5(c), in step s3, the reaction gas 114 is supplied into the film-forming container 11, whereby a desired thin layer 104 is formed over the surface of the substrate 100. The thin layer 104 is, for example, an organic EL protective film. In addition, the inert gas F is supplied from the inert gas supply portion 61 also during step s3.

Next, supplying of the reaction gas is stopped, and the purge gas is supplied to the gas inlet 20 (step s4 shown in FIG. 4). The purge gas 112 is supplied into the film-forming container 11. The purge gas 112 is discharged outside the film-forming container 11 from the outlet 30. The purge gas is supplied into the film-forming container 11 for, for example, 0.1 seconds. The outlet 30 allows the reaction gas 114 and purge gas 112 in the film-forming container 11 to be exhausted outside the film-forming container 11. As shown in FIG. 5(d), in step s4, the purge gas 112 is supplied into the film-forming container 11, whereby the reaction gas 114 is purged from the film-forming container 11. At this time, the inert gas F is also supplied from the inert gas supply portion 61.

By performing steps s1 to s4 described above, the thin layer 104 having a single atomic layer is formed over the substrate 100. Thereafter, steps s1 to s4 are repeated a predetermined number of times such that the thin layer 104 having a desired film thickness can be formed.

As described above, in the atomic layer deposition apparatus 10 of the second embodiment, the inert gas F is supplied (introduced) from the inert gas supply portion 61 into the film-forming container 11 via the stage stopper gas supply channel 17A formed in the stage stopper 17 during the film-forming process (during steps s1 to s4). In this manner, the inert gas F is supplied to the side portion of the susceptor 50 and the film-forming space S. Therefore, the amount of film deposition on the upper susceptor substrate holding portion 52B can be reduced. As a result, frequency of cleaning the inside of the film-forming container 11 by wet etching can be reduced.

In addition, in the atomic layer deposition method of the second embodiment, the inert gas F is continuously flowed in the gap between the substrate 100 and the susceptor deposition prevention member 15 and the gap between the upper susceptor substrate holding portion 52B and the susceptor deposition prevention member 15 during the film-forming process.

In this manner, a constant pressure can be constantly maintained in the film-forming container 11 during the film-forming process, as in the first embodiment. Particles are likely to generate when the pressure in the film-forming container 11 fluctuates, whereby film quality of the thin film formed over the substrate 100 deteriorates; however, in the atomic layer deposition method of the second embodiment, the inert gas F is continuously flowed during the film-forming process, whereby the pressure in the film-forming container 11 can be constantly maintained and generation of particles can be reduced.

As a result, film quality of the thin film formed over the substrate 100 can be improved.

In addition, by flowing the inert gas F in each of the gaps, entry of the source gas 110 and reaction gas 114 into each of the gaps can be prevented, whereby film deposition in each of the gaps can be suppressed.

In addition, in the atomic layer deposition apparatus 10 of the second embodiment, the stage stopper gas supply channel 17A serving as the inert gas supply channel is formed in the stage stopper 17 fixed to the film-forming container 11. In this manner, it is possible to avoid a gas piping tube to be directly connected to the lower inert gas supply channel 62A of the lower susceptor 51, and there would be no need to consider abrasion caused by expansion and contraction of the gas piping tube that occurs when the stage 14 is vertically moved. Further, the metal O-ring 55 can provide conduction between the stage stopper 17 and the lower susceptor peripheral portion 51A as well as sealing the contact portion between the stage stopper 17 and the lower susceptor peripheral portion 51A.

In addition, in the atomic layer deposition apparatus 10 of the second embodiment, by arranging the upper susceptor peripheral portion 52A at a position between the substrate-side side surface of the stage stopper 17 and the side surface of the upper susceptor substrate holding portion 52B just below the substrate, that is, at a position more inward than the position of the substrate-side side surface of the stage stopper 17, the upper susceptor 52 can be easily attached and removed. As a result, maintenance workability of the film-forming container 11 and the upper susceptor 52 can be improved.

In the foregoing, the invention made by the present inventors has been concretely described based on the embodiments. However, it is needless to say that the present invention is not to be limited to the foregoing embodiments, and various modifications and alterations can be made within the scope of the present invention.

For example, the atomic layer deposition apparatus 10 described in the first and second embodiments may be configured to perform the film-forming process by using plasma, or may be configured to perform the film-forming process without using plasma.

In addition, in the first and second embodiments, a case where the thin film formed over the substrate 100 is an organic EL protective film has been described by way of example; however, the thin film may be, for example, a gate insulating film or the like of a MOSFET (Metal Oxide Semiconductor Field Effect Transistor).

Further, in the description of the foregoing embodiments, the first and second embodiments were described separately; however, the embodiments are not irrelevant to each other. For example, the first and second embodiments may be combined and applied to the present invention.

LIST OF REFERENCE SIGNS

10: atomic layer deposition apparatus
11: film-forming container
14: stage
15: susceptor deposition prevention member
17: stage stopper
17A: stage stopper gas supply channel
24: stage stopper deposition prevention member
50: susceptor
51: lower susceptor
52: upper susceptor
52A: upper susceptor peripheral portion (second susceptor)
52B: upper susceptor substrate holding portion (first susceptor)
62A: lower inert gas supply channel
62B: upper inert gas supply channel
100: substrate

The invention claimed is:

1. An atomic layer deposition apparatus comprising:
a film-forming container in which a film-forming process is performed on a substrate;
a vertically movable stage provided in the film-forming container;
a susceptor held on the stage and being configured to hold the substrate; and
a stage stopper configured to stop rising of the stage and, when in contact with the susceptor, partitioning a film-forming space in which the film-forming process is performed and a transporting space in which transport of the substrate is performed,
wherein
the susceptor comprises:
an upper susceptor constituted by an upper susceptor substrate holding portion configured to hold the substrate and an upper susceptor peripheral portion arranged in a periphery of the upper susceptor substrate holding portion; and
a lower susceptor configured to support the upper susceptor,
a side surface of an outer peripheral portion of the upper susceptor peripheral portion second susceptor is positioned more inward than a substrate-side side surface of the stage stopper,
a susceptor deposition prevention member is provided on and in contact with both an upper surface of the upper susceptor peripheral portion and an upper surface of the lower susceptor, and
the susceptor deposition prevention member is arranged between the stage stopper and the upper susceptor substrate holding portion.

2. The atomic layer deposition apparatus according to claim 1, wherein
the upper susceptor substrate holding portion includes a holding surface configured to hold the substrate, and
the upper susceptor peripheral portion is arranged at a lower position than the holding surface.

3. The atomic layer deposition apparatus according to claim 2,
wherein
the upper susceptor and the lower susceptor are fixed to each other at the upper susceptor peripheral portion.

4. The atomic layer deposition apparatus according to claim 1, wherein
an inert gas supply channel is formed in the susceptor and is configured to supply inert gas to the film-forming space via a gap between the substrate and the susceptor deposition prevention member and via a gap between the upper susceptor substrate holding portion and the susceptor deposition prevention member,
an inert gas supply portion configured to supply the inert gas to the inert gas supply channel is provided in the film-forming container, and
the inert gas supply portion is provided in a wall portion of the film-forming container and communicates with the film-forming space via the inert gas supply channel.

5. The atomic layer deposition apparatus according to claim 4,
wherein the inert gas supply channel formed in the susceptor is constituted by an upper inert gas supply channel formed in the upper susceptor, and a lower inert gas supply channel formed in the lower susceptor, and
the upper inert gas supply channel and the lower inert gas supply channel communicate with each other.

6. The atomic layer deposition apparatus according to claim 4,
wherein an inert gas discharge port is formed by the gap between the substrate and the susceptor deposition prevention member, and a plurality of the inert gas discharge ports are formed along an entire periphery of a vicinity of the upper susceptor substrate holding portion, or the inert gas discharge port is continuously formed along the entire periphery of the vicinity of the upper susceptor substrate holding portion.

7. The atomic layer deposition apparatus according to claim 6,
wherein the inert gas is discharged from the inert gas discharge port at a temperature within ±10% of a surface temperature of the stage.

8. The atomic layer deposition apparatus according to claim 2,
wherein an inert gas supply channel configured to supply inert gas from outside is provided in the susceptor, and
an inert gas supply port communicating with the inert gas supply channel is formed at a position between the upper susceptor substrate holding portion and the upper susceptor peripheral portion.

9. The atomic layer deposition apparatus according to claim 8,
wherein a plurality of the inert gas supply ports are formed.

10. The atomic layer deposition apparatus according to claim 8,
wherein an inert gas vent connected to the inert gas supply channel is formed in the film-forming container.

11. The atomic layer deposition apparatus according to claim 1, wherein
the upper susceptor substrate holding portion includes a holding surface to hold the substrate,
an inert gas supply channel is formed in the susceptor and is configured to supply inert gas to the film-forming space via a gap between the substrate and the susceptor deposition prevention member and via a gap between the upper susceptor substrate holding portion and the susceptor deposition prevention member,
an inert gas supply portion configured to supply the inert gas to the inert gas supply channel is provided in the film-forming container, and
a stage stopper gas supply channel connecting the inert gas supply channel of the susceptor and the inert gas supply portion of the film-forming container is formed in the stage stopper.

12. The atomic layer deposition apparatus according to claim 11,
wherein a plate electrode is arranged at a position facing the stage,
the stage and the susceptor are electrically connected to each other, and
the stage stopper and the susceptor are electrically connected to each other via a metal O-ring.

13. The atomic layer deposition apparatus according to claim 11,
wherein the upper susceptor peripheral portion is arranged at a position between the substrate-side side surface of the stage stopper and a side surface of the upper susceptor substrate holding portion just below the substrate.

14. The atomic layer deposition apparatus according to claim 11,
wherein the upper susceptor peripheral portion is arranged at a lower position than the holding surface, and
the upper susceptor and the lower susceptor are fixed to each other at the upper susceptor peripheral portion.

15. An atomic layer deposition method using the atomic layer deposition apparatus of claim 1, comprising the steps of:
(a) mounting a substrate on the susceptor provided on the stage;
(b) after the step (a), introducing source gas from a gas inlet provided on a film-forming container into the film-forming container such that the source gas is absorbed onto the substrate;
(c) after the step (b), introducing purge gas from the gas inlet into the film-forming container such that the source gas is discharged outside the film-forming container;
(d) after the step (c), introducing reaction gas from the gas inlet into the film-forming container such that the reaction gas is supplied onto the substrate and a desired thin film is formed over a surface of the substrate; and
(e) after the step (d), introducing purge gas from the gas inlet into the film-forming container such that the reaction gas is discharged outside the film-forming container, wherein, during the steps (b) to (e), inert gas is flowed in the film-forming container.

16. The atomic layer deposition method according to claim 15,
wherein the inert gas is introduced into the film-forming container via an inert gas supply channel formed in the susceptor, and the inert gas is supplied to a side portion of the susceptor and a film-forming space above the stage.

17. The atomic layer deposition method according to claim 15, wherein the inert gas is introduced into the film-forming container via a stage stopper gas supply channel formed in the stage stopper configured to stop rising of the stage, and the inert gas is supplied to a side portion of the susceptor and a film-forming space above the stage.

* * * * *